(12) United States Patent
Lombardo et al.

(10) Patent No.: US 10,103,281 B2
(45) Date of Patent: Oct. 16, 2018

(54) THIN REFRACTORY METAL LAYER USED AS CONTACT BARRIER TO IMPROVE THE PERFORMANCE OF THIN-FILM SOLAR CELLS

(75) Inventors: Salvatore Lombardo, Catania (IT); Cosimo Gerardi, Motta S. Anastasia (IT); Sebastiano Ravesi, Catania (IT); Marina Foti, Catania (IT); Cristina Tringali, Catania (IT); Stella Loverso, Catania (IT); Nicola Costa, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 202 days.

(21) Appl. No.: 13/598,096

(22) Filed: Aug. 29, 2012

(65) Prior Publication Data

US 2013/0048071 A1 Feb. 28, 2013

(30) Foreign Application Priority Data

Aug. 30, 2011 (IT) ................. MI2011A1559

(51) Int. Cl.
*H01L 31/0224* (2006.01)
*H01L 31/20* (2006.01)
(Continued)

(52) U.S. Cl.
CPC ...... *H01L 31/02366* (2013.01); *H01L 27/142* (2013.01); *H01L 31/022425* (2013.01);
(Continued)

(58) Field of Classification Search
CPC ............ H01L 31/1804; H01L 31/0527; H01L 27/1423; H01L 31/02363; H01L 31/02366; H01L 31/022491
(Continued)

(56) References Cited

U.S. PATENT DOCUMENTS 4,272,641 A * 6/1981 Hanak ........................ 136/249
4,450,316 A * 5/1984 Hamakawa ..... H01L 31/022466
136/256

(Continued)

OTHER PUBLICATIONS

Smole et al., "Analysis of TCO/p(a-Si:C:H) heterojunction and its influence on p-i-n a-Si:H solar cell performance," Journal of Non-Crystalline Solids 194, 1996, pp. 312-318.
(Continued)

*Primary Examiner* — Sadie White
(74) *Attorney, Agent, or Firm* — Seed IP Law Group LLP

(57) ABSTRACT

A thin film amorphous silicon solar cell may have front contact between a hydrogenated amorphous silicon layer and a transparent conductive oxide layer. The cell may include a layer of a refractory metal, chosen among the group composed of molybdenum, tungsten, tantalum and titanium, of thickness adapted to ensure a light transmittance of at least 80%, interposed therebetween, before growing by PECVD a hydrogenated amorphous silicon p-i-n light absorption layer over it. A refractory metal layer of just about 1 nm thickness may effectively shield the oxide from the reactive plasma, thereby preventing a diffused defect when forming the p.i.n. layer that would favor recombination of light-generated charge carriers.

21 Claims, 9 Drawing Sheets

(51) Int. Cl.
*H01L 31/0376* (2006.01)
*H01L 31/0236* (2006.01)
*H01L 27/142* (2014.01)
*H01L 31/0445* (2014.01)
*H01L 31/075* (2012.01)
*H01L 31/18* (2006.01)

(52) U.S. Cl.
CPC ............... *H01L 31/022466* (2013.01); *H01L 31/022491* (2013.01); *H01L 31/0445* (2014.12); *H01L 31/075* (2013.01); *H01L 31/1888* (2013.01); *H01L 31/202* (2013.01); *Y02E 10/50* (2013.01)

(58) Field of Classification Search
USPC ........................................................ 136/256
See application file for complete search history.

(56) References Cited

U.S. PATENT DOCUMENTS

| | | | | |
|---|---|---|---|---|
| 4,532,537 | A * | 7/1985 | Kane ................. | H01L 31/02161 136/249 |
| 4,554,478 | A * | 11/1985 | Shimomoto ............ | H01J 29/45 136/258 |
| 4,564,808 | A * | 1/1986 | Faughnan et al. ....... | 324/761.01 |
| 5,144,395 | A | 9/1992 | Miyajima et al. | |
| 5,981,867 | A | 11/1999 | Toyama et al. | |
| 2005/0012095 | A1 | 1/2005 | Niira et al. | |
| 2005/0087225 | A1 | 4/2005 | Morooka et al. | |
| 2005/0186342 | A1 | 8/2005 | Sager et al. | |
| 2006/0255341 | A1 * | 11/2006 | Pinnington et al. ............ | 257/79 |
| 2008/0178932 | A1 * | 7/2008 | Den Boer ......... | H01L 31/02246 136/256 |
| 2008/0188033 | A1 | 8/2008 | Choi et al. | |
| 2009/0075483 | A1 * | 3/2009 | Guha et al. ................... | 438/702 |
| 2009/0178711 | A1 | 7/2009 | Joo et al. | |
| 2009/0194150 | A1 | 8/2009 | Aoki | |
| 2010/0006145 | A1 * | 1/2010 | Lee .............................. | 136/255 |
| 2010/0089444 | A1 | 4/2010 | Thomsen et al. | |
| 2010/0269895 | A1 * | 10/2010 | Smith ............... | H01L 31/03529 136/255 |
| 2011/0253203 | A1 | 10/2011 | Myong | |

OTHER PUBLICATIONS

Prentice, "The effect of surface states at the SnO2/p-a-Si:H interface," Journal of Non-Crystalline Solids 262, 2000, pp. 99-105.
Dao et al., "Simulation and study of the influence of the buffer intrinsic layer, back-surface field, densities of interface defects, resistivity of p-type silicon substrate and transparent conductive oxide on heterojunction with intrinsic thin-layer (HIT) solar cell," Solar Energy 84, 2010, pp. 777-783.
Cannella et al "Capacitance study of thin film SnO2:F/p-type a-Si:H heterojunctions," Energy Procedia 3, 2011, pp. 51-57.
Cannella, et al., "Carrier transport mechanism in the $SnO_2$:F/p-type a-Si:H heterojunction", Journal of Applied Physics 110, 024502 (2011), 8 pages.

* cited by examiner

THIN REFRACTORY METAL LAYER USED AS CONTACT BARRIER TO IMPROVE THE PERFORMANCE OF THIN-FILM SOLAR CELLS

FIELD OF THE INVENTION

This disclosure relates to photovoltaic solar cells and, in particular, to thin film amorphous silicon solar panels and related processes.

BACKGROUND OF THE INVENTION

Thin-film solar cells based on hydrogenated amorphous silicon (a-Si:H) are a promising photovoltaic technology for delivering low-cost solar energy. They can be used for cost-effective applications, such as large area photovoltaic modules and cells on flexible substrates as well. The silicon is deposited at low temperatures (<200° C.) by using plasma-enhanced chemical vapor deposition (PECVD). This deposition technique is effective and enables the deposition on large area substrates with good uniformity. Moreover, deposition conducted at very low temperatures enables the utilization of many different types of substrates, such as metals, glass, plastics etc.
Unfortunately, the use of plasma inevitably affects the substrate material, often causing a diffused defect at the transparent front contact that increases recombination of light-generated charge carriers.

SUMMARY OF THE INVENTION

An approach is for improving the above mentioned drawback for a plasma-enhanced chemical vapor deposition fabrication technique of hydrogenated amorphous silicon (a-Si:H) solar panel.

Typically, transparent conductive oxide layers (TCO), such as ZnO or $SnO_2$ films, are used as front and in some cases also as back contacts for the p-i-n cells. In these devices, the interface between contact layers and a-Si:H plays an important role on cell performances. See F. Smole et al. J. Non Cryst. Solids 194, 312 (1996); Vinh Ai Dao et al., Solar Energy 84, 777 (2010); and J.S.C. Prentice et al. J. Non-Cryst. Solids, 262, 99 (2000). For better insight of this, the behavior of solar cell structure based on the stack sequence $SnO_2$:F/a-Si:H/Mo, which is typically used in commercial thin film silicon based solar cells, has been studied. The total capacitance of the studied structure may be modeled as a series of depletion capacitances of the two junctions connected back-to-back, i.e. at the transparent front contact, the junction $SnO_2$:F/a-Si:H and, at the back contact, the Mo/a-Si:H junction.

These verifications and analysis were prompted by a rewarding trade-off that could be reached between the ability of a refractory metal to withstand plasma aggression and possibly shield a more delicate TCO surface layer of a substrate of deposition of the hydrogenated amorphous silicon thin film, and the transparency of such refractory metal barrier to the light. Besides proving a remarkable effectiveness of the original intuition, it was found that even the contact band-offset of such an ultra-thin-metal/a-Si:H semiconductor interface that also could have a non-negligible effect on overall energy conversion efficiency at a modified interface.

Basically, a very thin layer of a strongly refractory metal, such as molybdenum, tungsten, tantalum or titanium, as an interlayer between a TCO contact layer and the a-Si:H layer of a p-i-n structure of a solar cell, may improve its performance. The structure disclosed herein may apply to and may be effective even in a so-called superstrate configuration of a common metal-back contact structure of a solar panel. A refractory metal is robust against the plasma action during the a-Si:H deposition; however, to be effective, the layer must be thinner than the "skin depth" of the metal, but sufficiently thick to act as a barrier to the plasma ions that are typically accelerated with a potential of about 100V.

The presence of a thin metal layer at the contact interface triggers the excitation of surface plasma polaritons (SPPs), the effects of which in improving light transmission and light capture in the absorption silicon layer of the cell will be discussed later in this description. For example, the refractory metal may comprise molybdenum, because it has adequate robustness to plasma aggression and light transmission higher than 85% at optimal thickness. Additionally, tungsten has also been found to be a viable alternative candidate, suggesting that even other refractory metals like tantalum and titanium may be employed.

BRIEF DESCRIPTION OF THE DRAWINGS

FIG. 1b shows the estimated energy band diagram of the double junction structure of FIG. 1a.

DETAILED DESCRIPTION OF THE PREFERRED EMBODIMENTS

Figure 1A:
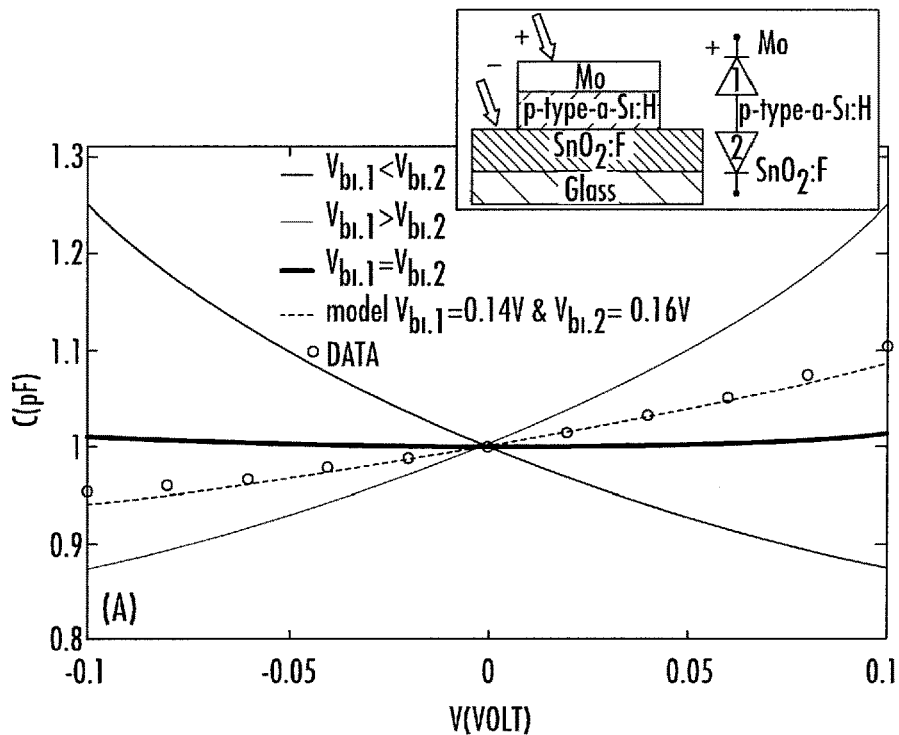
FIG. 1a shows simulated and experimental C-V curves related to a double junction structure $SnO_2$:F/a-Si:H/Mo and a schematic diagram of the double junction structure, according to the prior art.
Figure 2:
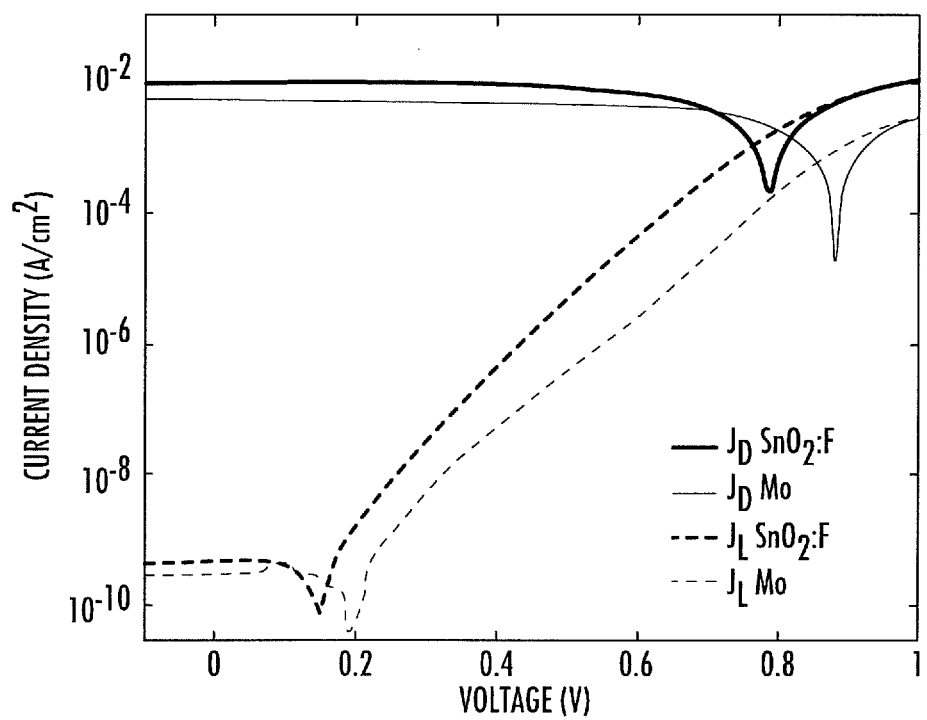
FIG. 2 are J-V characteristics recorded under illumination and dark conditions for a $SnO_2$:F/p-type-a-Si:H junction and for a Mo/p-type-a-Si:H junction, respectively, according to the prior art.

The experimental C-V and I-V characteristics of FIG. 1a and of FIG. 2, respectively, were both modeled by assuming a high interface state density and using the built-in voltages ($V_{bi}$) of the two junctions as fitting parameters. FIG. 1a shows the simulated and experimental C-V curves related to a typical structure comprising the double junction structure $SnO_2$:F/a-Si:H/Mo (in the example shown, the a-Si:H is a p-type layer), as sketched in the inset. The simulated C-V curves are for three different cases depending on the relative values of $V_{bi,1}$ and $V_{bi,2}$. If $V_{bi,1} > V_{bi,2}$, the capacitance decreases; if $V_{bi,1} < V_{bi,2}$, the capacitance increases. If $V_{bi,1} = V_{bi,2}$, the capacitance is almost constant. The experimental data is in agreement with simulated curves assuming $V_{bi,SnO2:F} = 0.16V$ and $V_{bi,Mo} = 0.14V$.

Figure 1B:
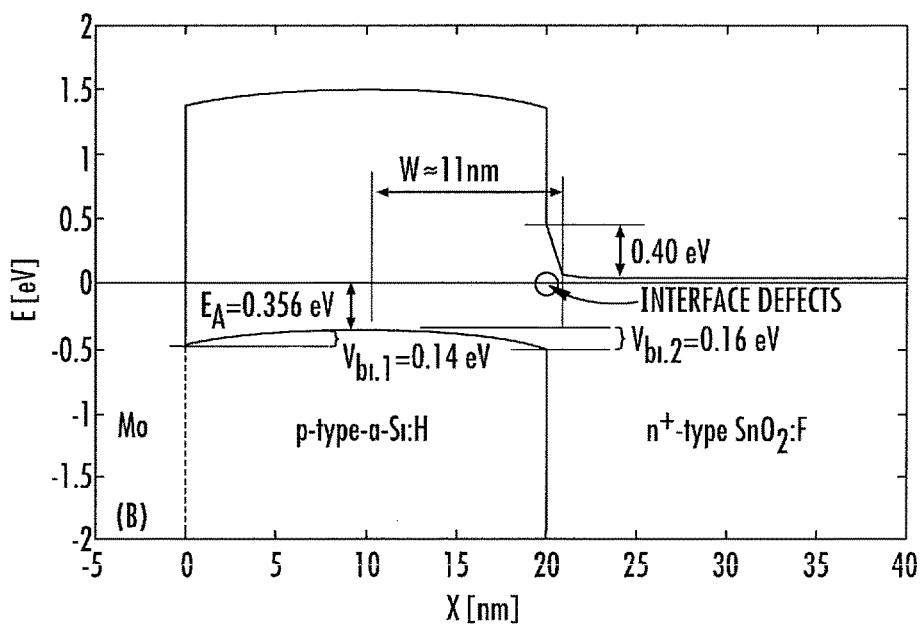

FIG. 1b shows the estimated energy band diagram of the junction Mo/p-type-a-Si:H and of the junction $SnO_2$:F/p-type-a-Si:H. In order to explain the experimental I-V characteristics, a Gaussian surface state density of $4.0 \times 10^{13}$ $cm^{-2}$, located 0.4 eV above the valence band edge of the p-type a-Si:H layer, must be assumed. See G. Cannella et al. in press on J. Appl. Phys. (2011). The $V_{bi}$ of the $SnO_2$:F/p-type-a-Si:H interface is higher than that of the Mo/p-type-a-Si:H interface, with a difference of about 20 mV. This means that molybdenum provides a better Schottky contact with p-type-a-Si:H than $SnO_2$:F.

Comparative test samples of thin film a-Si:H solar cells with p-i-n configuration were fabricated, some using a SnO2:F and other molybdenum rear contacts with the p-type-a-Si:H film. In both types of test samples, the front contact of the cells was identical and included a ZnO:Al transparent conducting layer.

Figure 4:
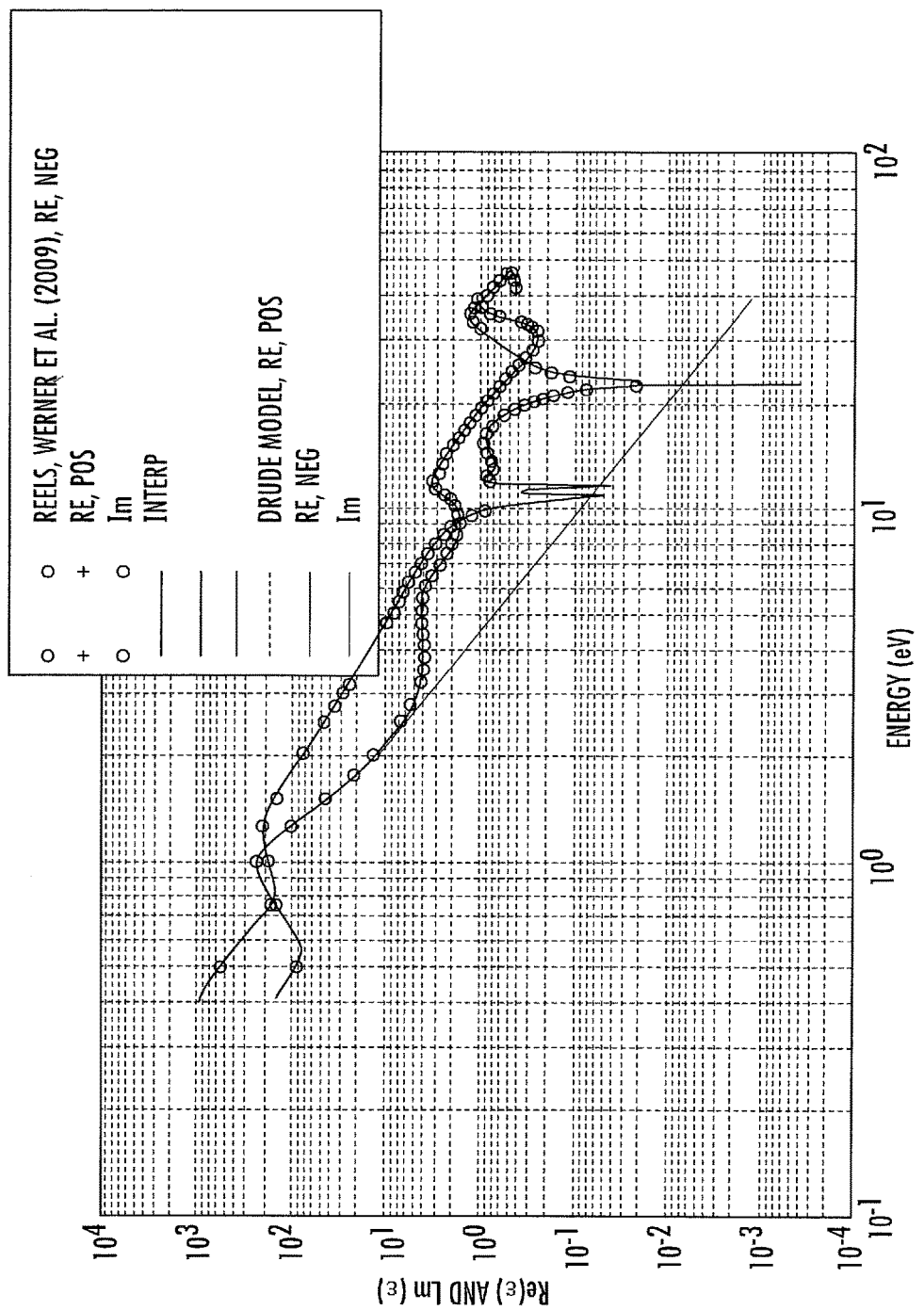
FIG. 4 shows $Re(\varepsilon)$ and $Im(\varepsilon)$ characteristics of molybdenum as measured with REELS (circles) and calculated using the Drude model (lines), according to the present invention.

Analysis was done by measuring cell parameters at AM1.5G and in dark. The utilized figures were averaged over 100 devices of each type. With reference to FIG. 4, where a comparison of typical J-V curves for the two cell types is illustrated, an improvement of about 100 mV in the open circuit voltage ($V_{oc}$) can be observed for the cell with molybdenum contact compared to the cell with $SnO_2$:F contact. Such an improvement cannot be explained only in terms of barrier height difference (~20 meV). More insight is provided by dark J-V characteristics shown in FIG. 2. Indeed, a much lower diode saturation is observed in the molybdenum contact samples (one decade lower than in the $SnO_2$ contact samples), which is consistent with the improvement of $V_{oc}$. It may be suggested that in addition to the lower barrier height, a lower carrier recombination takes place in the case of a Mo/p-type a-Si:H junction, likely due to a lower defect density in the intrinsic a-Si:H layer.

Molybdenum is a highly refractory material and suffers less from plasma damaging during the PECVD growth of a-Si:H p-i-n layer on it. This allows reduction in the defects that are generated when the contact is exposed to the high reactive plasma environment, necessary for the deposition of the p-i-n layer. Therefore, compared with the more vulnerable non-$SnO_2$:F contact, when using molybdenum as a substrate for PECVD, a lesser number of the plasma-generated impurities migrate in the sensing regions of the p-i-n layer (particularly in the intrinsic layer), thus promoting a longer life-time and lower recombination of photon-generated electron-hole pairs.

This is particularly effective in the substrate configuration of thin film solar cells where the front electrode (the electrode exposed to the light), which typically is a transparent conductive layer ($SnO_2$, ZnO, ITO, etc.), is deposited at the end of the fabrication process, after the reactive plasma process (PECVD) of deposition of the p-i-n a-Si:H layer. Differently, for a so-called superstrate configuration, in which the front electrode TCO is the substrate of deposition of the p-i-n a-Si:H layer, the situation changes. In fact, TCO is not a refractory material and is subject to aggression by the reactive plasma.

Figure 3A:
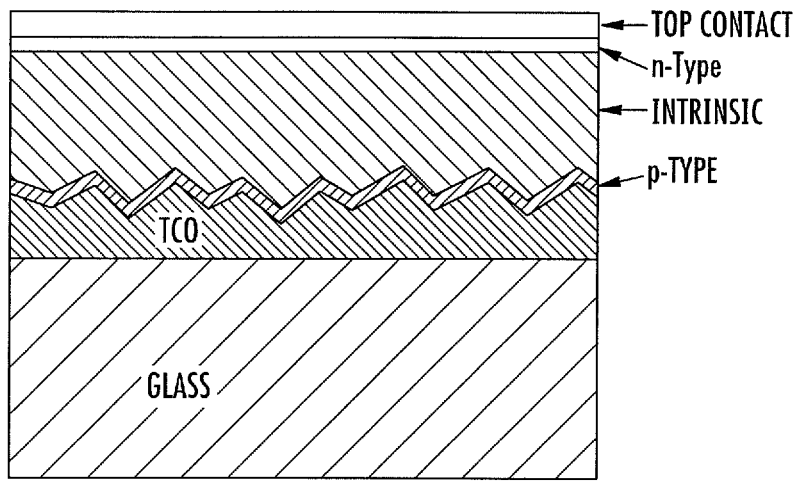
FIG. 3a shows a superstrate configuration of a hydrogenated amorphous silicon (a-Si:H) solar cell, according to the prior art.

A typical superstrate configuration 20 is depicted in FIG. 3a. The superstrate configuration 20 illustratively includes a glass layer 26, a TCO layer 25 thereon, p-type silicon 24 on the TCO layer, an intrinsic zone 23 thereon, n-type silicon 22 on the intrinsic zone, and a top contact 21 on the n-type silicon. In a conventional p-i-n superstrate structure, the light illuminates the cell from the bottom. A textured TCO layer 25 is generally used as contact in order to enhance a light trapping effect. TCO is typically made of $SnO_2$:F or ZnO:B or ZnO:Al, with a resistivity of $0.8–1 \times 10^{-3}$ Ohm cm and an adequate transmittance in the wavelength range between 350 nm and 1,200 nm.

Figure 3B:
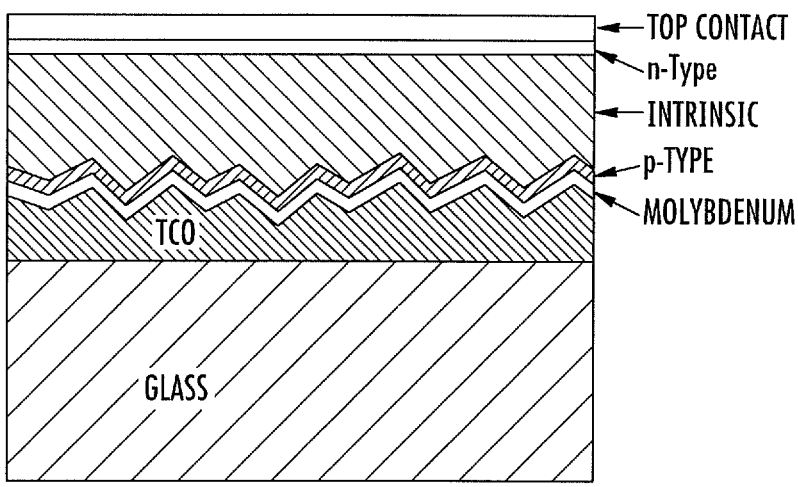
FIG. 3b shows a superstrate hydrogenated amorphous silicon (a-Si:H) solar cell structure with a thin interlayer of refractory metal between the TCO layer and the p-i-n layer of amorphous silicon, according to the present invention.

The superstrate structure 30 of the present disclosure is depicted in FIG. 3b. The superstrate configuration 30 illustratively includes a glass layer 36, a TCO layer 35 thereon, an interlayer refractory metal 34 on the TCO layer, p-type silicon 33 on the refractory metal, an intrinsic zone 37 thereon, n-type silicon 32 on the intrinsic zone, and a top contact 31 on the n-type silicon. The structure has an interlayer 33 of a refractory metal that may be chosen among molybdenum, tungsten, tantalum and titanium, of thickness adapted to ensure adequate transmittance, between the TCO and the p-i-n layer. The process of the present disclosure, compared to a normal flow of the typical fabrication process of a superstrate structure, includes an additional step of depositing on top of the TCO (front contact layer) a very thin layer of refractory metal, molybdenum in the shown example, that has the function of reinforcing the conductive contact layer on which the p-i-n layer, typically of hydrogenated amorphous silicon, is successively grown.

These findings lead to significant enhancement of the contact barrier, making it more resistant against the reactive plasma used for successively depositing/growing the p-i-n layer. Improvement of the contact leads to a better contact/a-Si:H barrier (improved band-offset) as well as decreasing recombination rate because of a reduced density of defects in the semiconductor phonon absorption region.

In order to ensure an adequate transmission of the light, it is important to limit the thickness of the refractory metal interlayer. Thereby, it is necessary to establish the best trade-off between positive effects on $V_{oc}$ and transmittance of the interlayer.

Physics Background for the Exemplary Case of a Molybdenum Interlayer

FIG. 4 shows the real and imaginary parts of the dielectric constant of Molybdenum, measured by Reflection Electron Energy Loss Spectroscopy—(REELS) (circles) and calculated by using the classical Drude model. See W. A. Harrison, "Solid State Theory," Dover Publication Inc, New York, 1979. The dielectric constant of metals in the visible range is negative because of the response of conduction electrons, as explained by the Drude model (lines in the figure). The dielectric constant is then zero in correspondence of the plasma frequency and becomes positive at high frequencies tending to one in the UV range.

The Drude model explains the real part of the dielectric constant; however, the imaginary part deviates remarkably from the experimental values (FIG. 4). In fact, the experimental value is much higher than that expected from the Drude theory. In other words, the dissipative part of the radiation propagating in the metal is much higher.

From the dielectric constant ε, the complex refracting index n* can be derived. The refractive index can be written as:

$$n^* = n + ik; \quad (1)$$

where n and k are the real and imaginary part of the refractive index.

The absorption coefficient can be written as:

$$\alpha = \frac{4\pi k}{\lambda} = \frac{1}{\delta}; \quad (2)$$

where λ is the light wavelength in vacuum, and δ is the skin depth of the metal (molybdenum).

Figure 5:
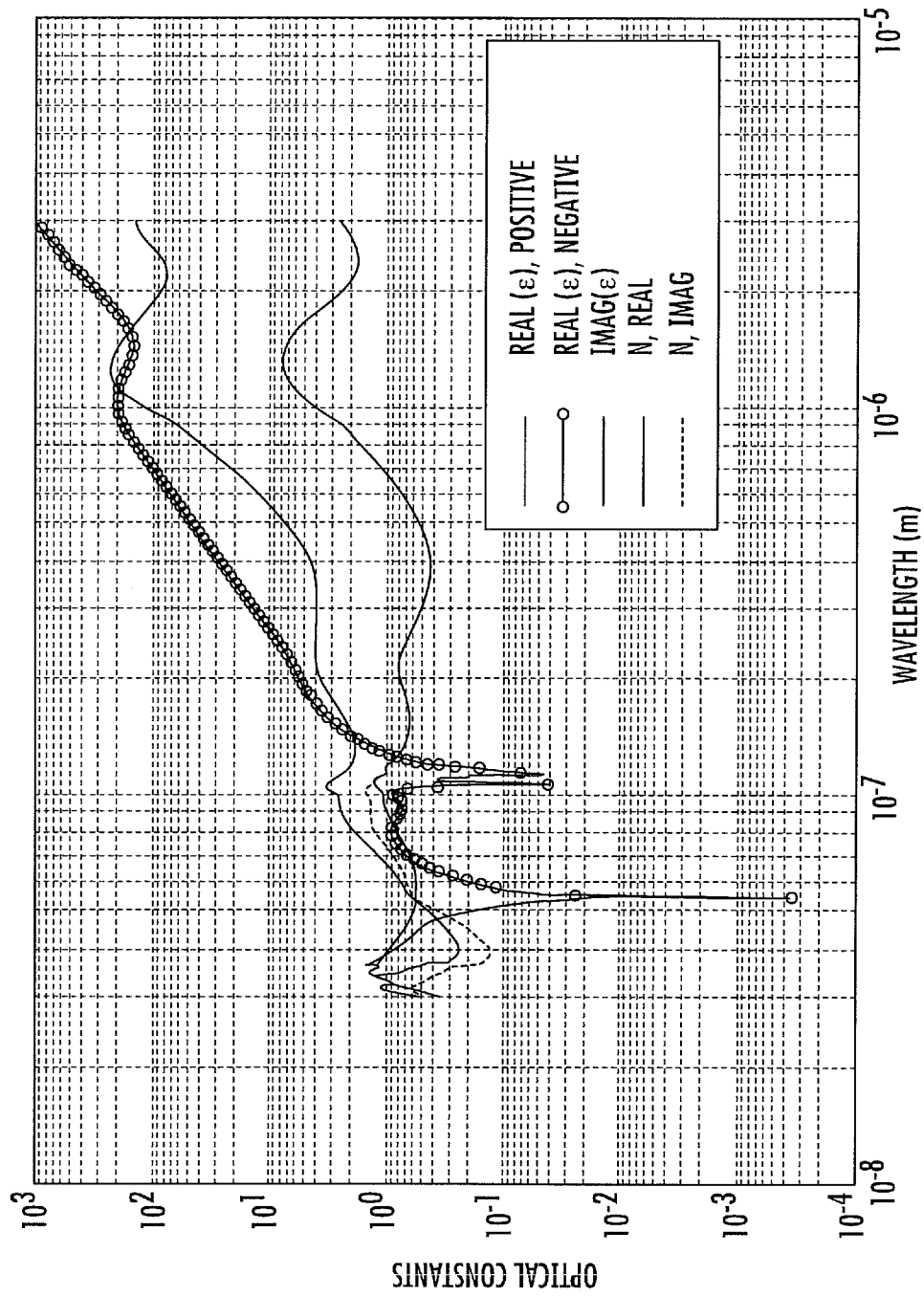
FIG. 5 shows diagrams of optical constants of molybdenum vs. wavelength, experimental values of n and k as a function of the wavelength and energy for molybdenum, tantalum and tungsten, according to the present invention.

FIG. 5 shows the experimental values of Re(ε), Im(ε), n and k as a function of the wavelength in vacuum. From the optical constants, the metal response to the radiation can be evaluated. When the frequency is high, i.e. greater than the plasma frequency (υp) value, the dielectric constant of the metal is positive and the radiation can propagate in the metal, giving rise to longitudinal wave modes that propagate laterally along the metal-dielectric interface. Such modes, defined as surface plasma polaritons couple optical radiation and plasma electrons collective oscillations known as plasmons. See C. Kittel, "Introduction to Solid State Physics," Wiley (1986), p. 253.

To very high frequencies, the metal becomes transparent (n→1 and k→0). On the other hand, when the dielectric constant is negative and assumes high values (for frequencies υ<υp), the reflectivity is very large and the transmitted component of the radiation originates evanescent waves, which propagate in depth for very small distances.

Figure 6:
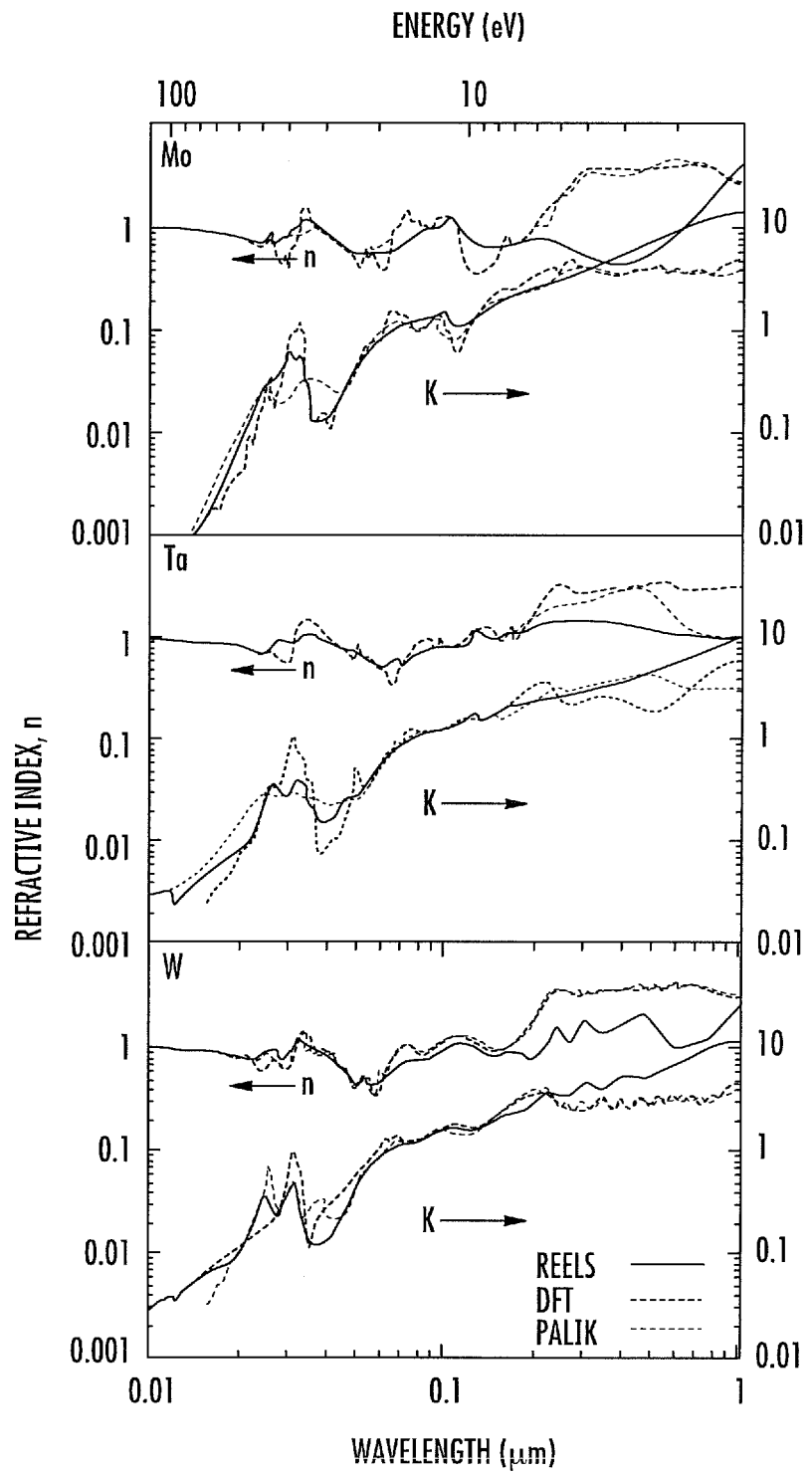
FIG. 6 shows experimental values of n and k as a function of the wavelength and energy for molybdenum, tantalum and tungsten, according to the present invention.

FIG. 6 shows a comparison of molybdenum with the other refractory metal candidates, such as Ta and W, which exhibit a behavior quite similar to the case of molybdenum. At the vacuum/metal interface, or more in general at the dielectric/metal interface, longitudinal wave modes are generated. These collective oscillations propagate laterally along the metal/dielectric interface. Such longitudinal modes couple the optical radiation with oscillating collective modes of conducting electrons of the metal, which are defined as surface plasmon-polaritons (spp) modes.

Figure 7:
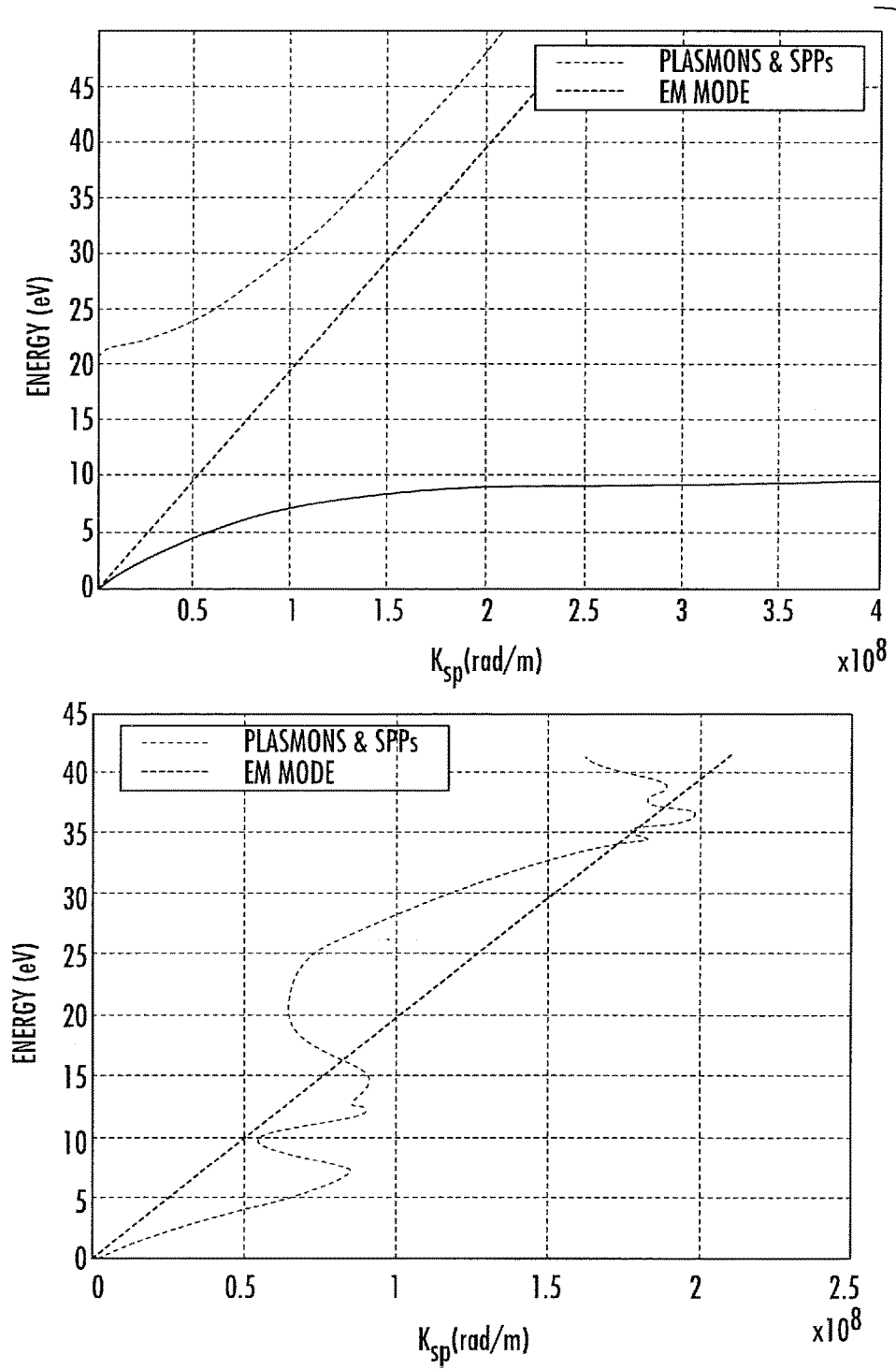
FIG. 7 shows dispersion curves (energy vs. wave-vector $k_{SPP}$): from the Drude's model, at the top, and when effective values of $Re(\varepsilon)$ and $Im(\varepsilon)$ are considered, at the bottom, according to the present invention.

According to Drude's theory, the dispersion relation which relates the wave-vector $$k_{spp} = \frac{2\pi}{\lambda_{spp}} \quad (3)$$

of the SPP modes to the frequency ω (where ω=2πυ), is shown at the top of FIG. 7.

In the figure, the top part corresponds to the plasmon part and the bottom part is that of polaritons, SPPs. When the effective values of Re(ε) and Im(ε) are considered, the dispersion curve changes significantly, and the behavior is shown at the bottom of the figure. Plasmon and SPP modes have much smaller extinction lengths, i.e. they are quenched very quickly, propagating in the metal (plasmons) or along the dielectric/metal interface (polaritons).

Figure 8:
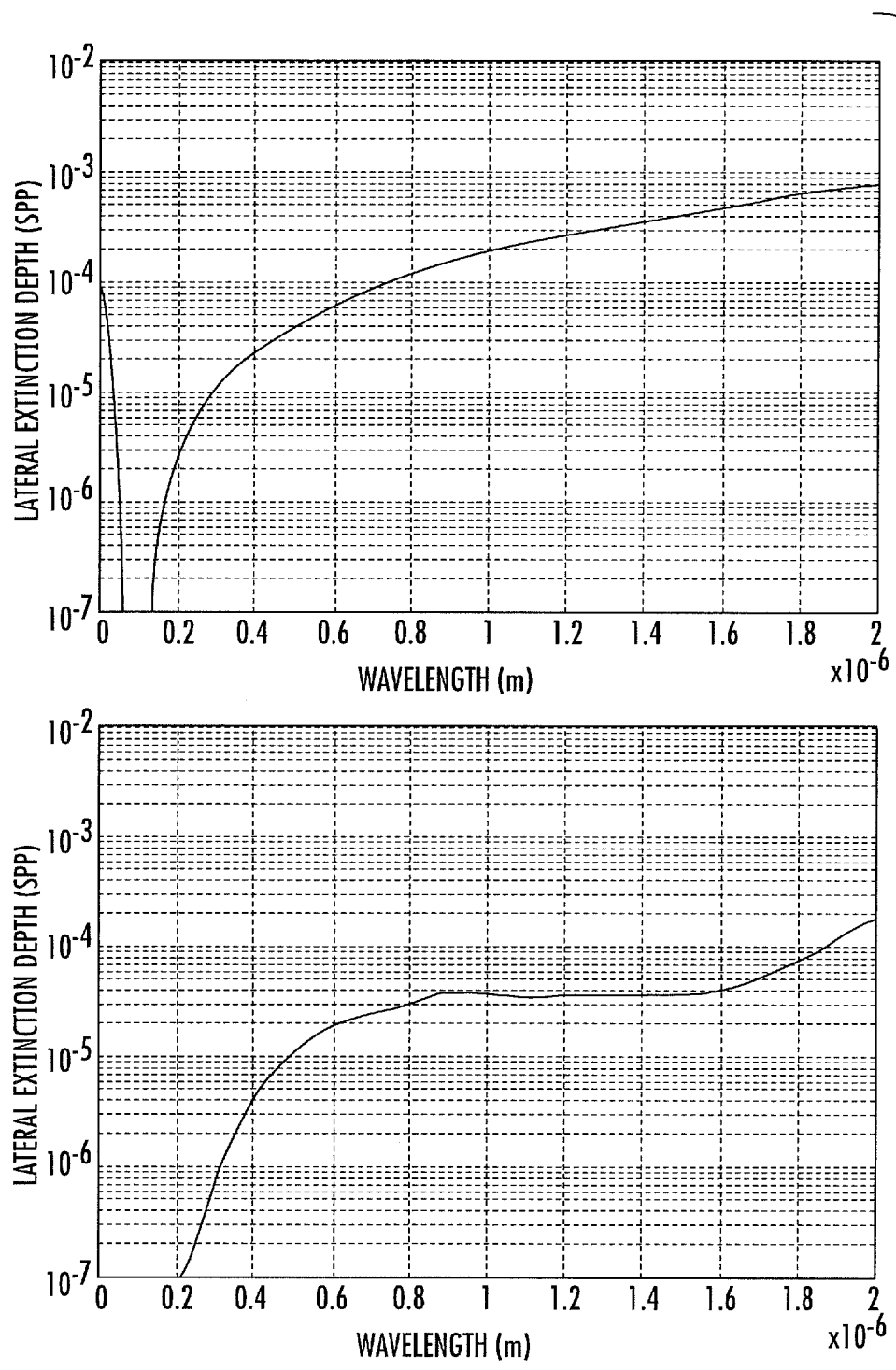
FIG. 8 shows diagrams of lateral skin depth of SPP modes as a function of the wavelength evaluated by starting from experimental values of $\varepsilon$: the ideal case of the Drude's theory at the top and the experimental case at the bottom, according to the present invention.

In particular, at the bottom of FIG. 8, the lateral extinction length of SPP modes as a function of the wavelength in vacuum evaluated by using the experimental values of the dielectric constant is shown. The ideal behavior calculated from Drude's model is shown at the top of the figure, where it can be observed that the ideal value of extinction length is much higher.

Figure 9:
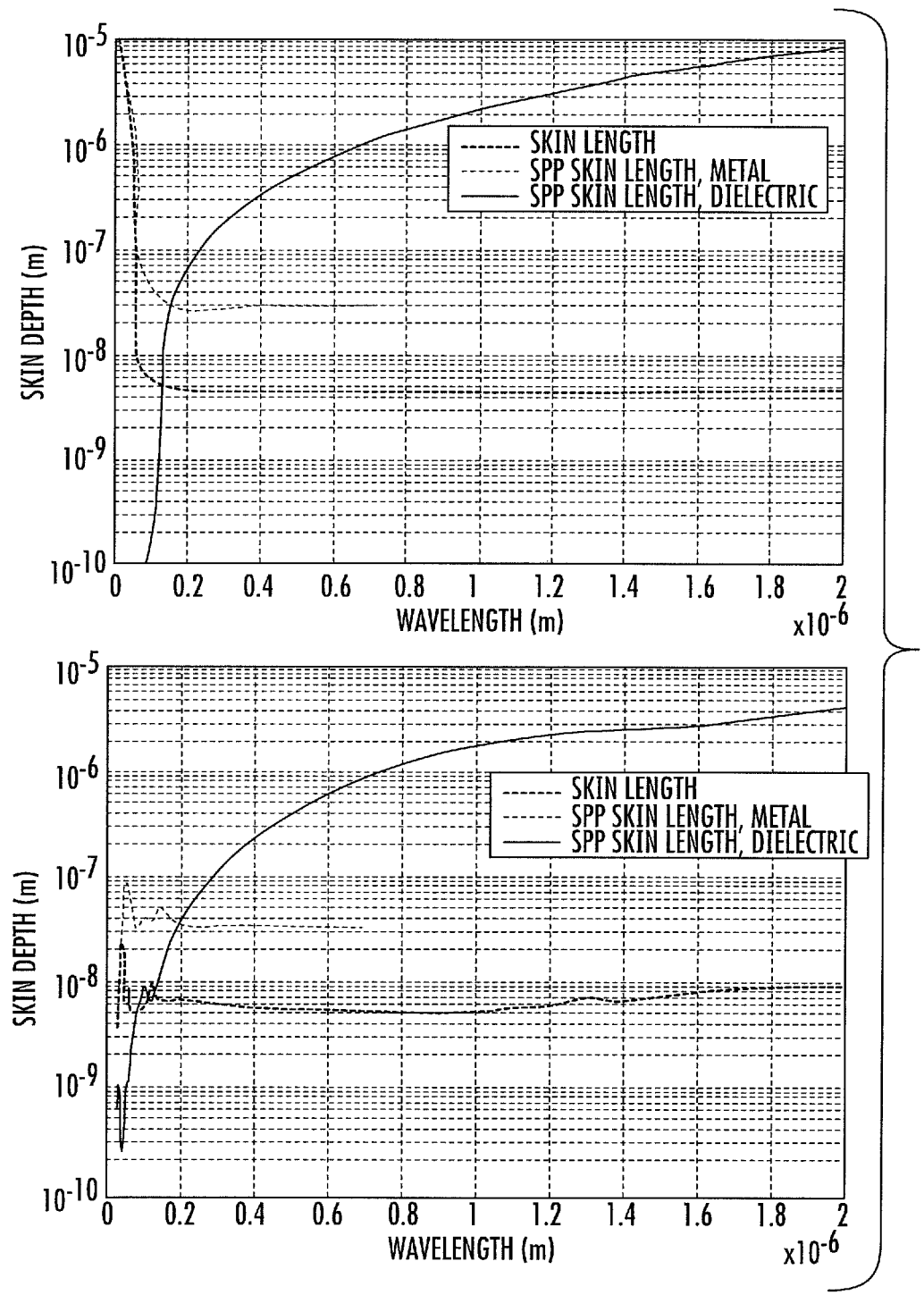
FIG. 9 shows diagrams of skin depth vs. wavelength for both SPP and Plasmon modes and for the evanescent waves in the metal: calculated according the Drude's model, at the top, and obtained starting from the experimental n and k values, at the bottom, according to the present invention.

In a similar way as in FIG. 8, FIG. 9 depicts the skin depths δ as a function of the wavelength (in vacuum) both for SPP and plasmon modes and for the evanescent waves in the metal. For SPP modes, the figure shows the extinction lengths both in the dielectric and in the metal. Because SPPs are surface modes, they are localized only at the interface, whereas they vanish in the perpendicular direction, along the direction of the dielectric and of the metal. Note that the extinction depth of SPP is higher in the dielectric than in the metal over the whole spectrum, starting from 200 nm. This suggests that the radiation is confined mainly in the dielectric part, with a significant light trapping effect. The values of the skin lengths in the metal in a range of wavelengths between 200 nm and 1 μm are about 6 nm, for evanescent waves, and 30-40 nm for SPPs.

In the structure depicted in FIG. 3b, when the light impinges on the interface TCO/Mo, it will give rise to evanescent waves and to SPP modes that propagate laterally along the interface. If the Mo layer is thin enough, the attenuation produced by the metal layer is sufficiently low, leading to an acceptable transmission of the radiation. It is possible to estimate an adequate thickness for the Mo layer, which is of about 1 nm. Considering only the effect of the evanescent waves, the attenuation would be at most of about exp(−1 nm/6 nm), which corresponds to about 85%.

Actually, it is expected that the value may be higher than 85% due to the effects of the forming of SPPs that propagate laterally along the Mo/a-Si:H interface. Reasonably, it is expected that if the TCO surface is textured, as it is a typical practice in the art, hence with a relatively high roughness, even if the radiation hits the surface orthogonally (as in the case of solar cells under optimal orientation conditions), it will promote the excitation of both evanescent optical radiation waves (evanescent waves) and SPP modes (surface plasma polaritons). Thereby, the intensity of radiation passing through the Mo layer and reaching the semiconductor will be higher than the contribution due to the evanescent waves only. That is, the effective transmittance of a molybdenum layer of about 1 nm thickness is expected to be higher than 85% (which is the contribution if only the evanescent waves are considered). On the other hand, beneficial effects by a Mo layer of 1 nm on the Voc are expected. Indeed, from an electrostatic viewpoint, a thin metal layer of 1 nm is equivalent to a bulk metal, considering that the Thomas-Fermi screening length in a metal like molybdenum is of 0.05 nm.

As far as the screening function of the refractory metal interlayer from the reactive plasma of the PECVD process of the p-i-n layer is concerned, considering that the "projected range" and the "longitudinal straggling" of Si ions of about 100 mV in molybdenum are of about 0.5 nm and of about 0.6 nm, respectively, it may be reasonably concluded that a molybdenum layer of 1 nm is able to effectively shield the underlying TCO from the reactive plasma and thus prevent formation of impurities during the PECVD growth of the p-i-n silicon layer.

Basically, the fabrication process of thin film amorphous silicon solar cells comprising at least one of front and rear cell contacts between a hydrogenated amorphous silicon layer and a transparent conductive oxide layer, comprises the sequence of steps of: depositing a transparent conductive oxide layer for either a front or a rear cell contact; depositing a layer of refractory metal, chosen among the group including molybdenum, tungsten, tantalum and titanium, of thickness adapted to ensure a light transmittance above 80%, over a contact surface of the transparent conductive oxide layer; and depositing by plasma enhanced chemical vapor deposition hydrogenated amorphous silicon as far as growing a cell p-i-n layer, over the refractory metal contact interlayer.

By texturing of the surface of the deposited layer of transparent conductive oxide, typically sub-oxides of Zn or of Sn (i.e. non stoichiometric ZnO or $SnO_2$) may be produced for enhancing incident light trapping according to a common practice in the art. Texturing is commonly done by etching the surface of the deposited layer of transparent conductive oxide with HCl. Preferably, a desirable morphology of the textured surface is pre-tuned by varying parameters like pressure, temperature and gas flow rate in the deposition chamber during deposition of the oxide. Sputtering, chemical vapor deposition techniques and sequential chemical vapor deposition of atom thick layers techniques may be used for depositing the refractory metal layer over the layer of transparent conductive oxide.

A highly conformal layer of refractory metal may be obtained even on a textured surface of transparent conductive oxide with low pressure chemical vapor deposition (LP-CVD) or even more so by sequential chemical vapor deposition of atom thick layers as, for example, with the so called atomic layer deposition (ALD) technique. For background, see N. Ashcroft, N. D. Mermin, "Solid State Physics", Saunders College Publishing, Fortsworth, Philadelphia, (1976) p. 551.

That which is claimed is:

1. A solar cell comprising:
   a contact;
   an n-type semiconductor layer in direct contact with the contact;
   an intrinsic semiconductor layer in direct contact with the n-type semiconductor layer, the intrinsic semiconductor layer having a first surface that is planar and a second surface that is textured opposite the first surface, the first surface being in direct contact with the n-type semiconductor layer;
   a p-type semiconductor layer, the p-type semiconductor layer having a third surface and a fourth surface, the third surface being in direct contact with the second surface of the intrinsic semiconductor layer, the third surface and fourth surface being textured;
   a refractory metal layer having a fifth surface and a sixth surface, the fifth surface being in direct contact with the fourth surface of the p-type semiconductor layer, the fifth and sixth surfaces being textured;
   a transparent conductive oxide layer having a seventh surface and an eighth surface, the seventh surface being textured and in direct contact with the sixth surface of the refractory metal layer, the eighth surface being planar; and
   a glass substrate having a ninth surface in direct contact with the eighth surface.

2. The solar cell of claim 1 wherein the refractory metal layer includes molybdenum and has a thickness of about 1 nanometer (nm).

3. A thin film silicon solar cell comprising:
   a contact;
   a first conductivity type semiconductor layer having a first planar surface and a second planar surface, the first planar surface being in direct contact with the contact;
   a second conductivity type semiconductor layer having a first textured surface and a second textured surface;
   an intrinsic silicon semiconductor layer, the first conductivity type semiconductor layer being spaced from the second conductivity type semiconductor layer by the intrinsic silicon semiconductor layer, a first textured surface of the intrinsic silicon semiconductor layer in direct contact with the first textured surface of the second conductivity type semiconductor layer, a second planar surface of the intrinsic silicon semiconductor layer being in direct contact with the first planar surface of the first conductivity type semiconductor layer;
   a transparent conductive oxide layer having a first textured surface and a second planar surface;
   a refractory metal layer having a first textured surface and a second textured surface, the first textured surface of the refractory metal layer being in direct contact with the second textured surface of the second conductivity type semiconductor layer, and the second textured surface of the refractory metal layer being in direct contact with the first textured surface of the transparent conductive oxide layer; and
   a transparent substrate in direct contact with the second planar surface of the transparent conductive oxide layer.

4. The thin film silicon solar cell of claim 3 wherein the refractory metal layer has a thickness that allows for a light transmittance of at least 80%.

5. The thin film silicon solar cell of claim 3 wherein the refractory metal layer includes molybdenum and has a thickness of about 1 nm.

6. A solar panel comprising:
   a thin film silicon solar cell including:
      a top contact;
      a first semiconductor layer of a first conductivity type, the first semiconductor layer having a first surface and a second surface that are planar, the first surface being in direct contact with the top contact;
      a second semiconductor layer on the first semiconductor layer, the second semiconductor layer having a first surface that is planar and a second surface that is textured opposite the first surface, the first surface of the second semiconductor layer being on the second surface of the first semiconductor layer;
      a third semiconductor layer of a second conductivity type, a first surface of the third semiconductor layer being in direct contact with a second surface of the second semiconductor layer, the third semiconductor layer having a second surface opposite the first surface, the first surface and the second surface of the third semiconductor layer being textured;
      a transparent conductive oxide layer having a first surface that is textured and a second surface that is planar;
      a refractory metal layer having a first surface and a second surface, the first and second surfaces being textured, the first surface of the refractory metal layer being in direct contact with the second surface of the third semiconductor layer, the second surface of the refractory metal layer being in direct contact with the first surface of the transparent conductive oxide layer; and
      a glass substrate in direct contact with the second surface of the transparent conductive oxide layer.

7. The solar panel of claim 6 wherein the refractory metal layer includes molybdenum and has a thickness of about 1 nm.

8. The solar cell of claim 1 further comprising a contact having a ninth surface that is planar, the ninth surface being in direct contact with a tenth surface of the n-type semiconductor layer, the tenth surface being planar.

9. A thin film solar cell comprising:
a top contact;
a p-i-n structure including:
an n-type semiconductor layer having a first planar surface and a second planar surface in direct contact with the top contact;
a p-type semiconductor layer having a first textured surface and a second textured surface opposite the first textured surface; and
an intrinsic semiconductor layer having a first planar surface and a second textured surface, the first planar surface of the intrinsic semiconductor layer being in direct contact with the first planar surface of the n-type semiconductor layer and the second textured surface of the intrinsic semiconductor layer in direct contact with the first textured surface of the p-type semiconductor layer;
a refractory metal layer having a first textured surface and a second textured surface, the first textured surface of the refractory metal layer in direct contact with the second textured surface of the p-type semiconductor layer;
a transparent conductive oxide layer having a first textured surface and a second planar surface, the first textured surface being in direct contact with the second textured surface of the refractory metal layer; and
a glass substrate in direct contact with the second planar surface of the transparent conductive oxide layer.

10. The thin film solar cell of claim 9 wherein the refractory metal layer has a thickness that allows for a light transmittance of at least 80%.

11. The thin film solar cell of claim 9 wherein the refractory metal layer includes molybdenum and has a thickness of about 1 nm.

12. The solar cell of claim 1 wherein the refractory metal layer includes at least one of molybdenum, tungsten, tantalum, and titanium.

13. The solar cell of claim 1 wherein the refractory metal layer has a thickness that allows for a light transmittance of at least 80%.

14. The thin film silicon solar cell of claim 3 wherein the refractory metal layer includes at least one of molybdenum, tungsten, tantalum, and titanium.

15. The thin film silicon solar cell of claim 3 wherein the first conductivity type semiconductor layer, the second conductivity type semiconductor layer, and the intrinsic silicon semiconductor layer form a p-i-n structure.

16. The solar panel of claim 6 wherein the refractory metal layer includes at least one of molybdenum, tungsten, tantalum, and titanium.

17. The solar panel of claim 6 wherein the second semiconductor layer is an intrinsic semiconductor.

18. The solar panel of claim 6 wherein the refractory metal layer has a thickness that allows for a light transmittance of at least 80%.

19. The solar panel of claim 6 wherein the first semiconductor layer, the second semiconductor layer, and the third semiconductor layer form a p-i-n structure.

20. The thin film solar cell of claim 9 wherein the refractory metal layer includes at least one of molybdenum, tungsten, tantalum, and titanium.

21. The solar cell of claim 1, wherein the transparent conductive oxide layer includes $SnO_2$:F, ZnO:B, or ZnO:Al.

* * * * *

UNITED STATES PATENT AND TRADEMARK OFFICE
CERTIFICATE OF CORRECTION

PATENT NO. : 10,103,281 B2
APPLICATION NO. : 13/598096
DATED : October 16, 2018
INVENTOR(S) : Lombardo et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 490 days.

Signed and Sealed this
Fourteenth Day of May, 2019

Andrei Iancu
*Director of the United States Patent and Trademark Office*